United States Patent [19]
Tachikawa et al.

[11] Patent Number: 5,620,521
[45] Date of Patent: Apr. 15, 1997

[54] METHOD FOR SURFACE TREATMENT

[75] Inventors: Hideo Tachikawa, Aichi-ken; Hiromasa Takeda, Miyagi-ken; Kazuyuki Nakanishi, Aichi-ken, all of Japan

[73] Assignee: Kabushiki Kaisha Toyota Chuo Kenkyusho, Aichi-ken, Japan

[21] Appl. No.: 386,230

[22] Filed: Feb. 10, 1995

Related U.S. Application Data

[63] Continuation of Ser. No. 83,886, Jun. 28, 1993, abandoned.

[30] Foreign Application Priority Data

Jun. 30, 1992 [JP] Japan .................. 4-197602

[51] Int. Cl.$^6$ .................. C23C 16/00
[52] U.S. Cl. .................. 118/717; 118/407; 118/716; 118/DIG. 5; 427/213; 427/249; 427/255.2; 427/255.4; 148/240
[58] Field of Search .................. 118/407, 620, 118/716, 717, 724, DIG. 5; 427/213, 249, 255.2, 255.4; 148/240

[56] References Cited

U.S. PATENT DOCUMENTS

| | | | |
|---|---|---|---|
| 4,217,851 | 8/1980 | Biehl et al. | 118/20 |
| 4,314,525 | 2/1982 | Hsu et al. | 118/716 |
| 4,381,728 | 5/1983 | Walling et al. | 118/621 |
| 4,569,862 | 2/1986 | Arai et al. | 427/255 |
| 4,637,837 | 1/1987 | von Matuschka et al. | 148/6 |
| 4,786,526 | 11/1988 | Arai et al. | 427/249 |
| 4,806,387 | 2/1989 | Tamaki et al. | 427/46 |
| 4,844,949 | 7/1989 | Arai et al. | 427/213 |
| 5,236,503 | 8/1993 | Jones | 118/303 |

FOREIGN PATENT DOCUMENTS

| | | |
|---|---|---|
| 0166216 | 1/1986 | European Pat. Off. |
| 0252480 | 1/1988 | European Pat. Off. |
| 0303191 | 2/1989 | European Pat. Off. |
| 0471276 | 2/1992 | European Pat. Off. |

OTHER PUBLICATIONS

Muchi, Iwao et al, "Reaction Technology on Fluidizing Bed", Chemical Engineering, Series No. 8, pp. 17, 18, 26 27 and 71, Published by Baifukan, Feb. 25, 1984.

*Primary Examiner*—Harold Pyon
*Attorney, Agent, or Firm*—Jacobson, Price, Holman & Stern, PLLC

[57] ABSTRACT

A method for surface treatment in which a fluidizable powder mixture consisting of a powder of a refractory material, and a surface layer-forming powder of a metal, or alloy or both is fluidized by a fluidizing gas supplied through a gas distributor to form above the gas distributor a fluidized bed in which a surface layer is formed on the material to be treated under heating in the presence of a halide. A layer of coarse particles is disposed between the fluidized bed and the gas distributor, and the coarse particles have a mean diameter, D(m), as defined below:

$$(1650V\mu/PG)^{1/2} < D < 6.5d$$

where
V: velocity of the fluidizing gas (m/s);
$\mu$: viscosity coefficient of the fluidizing gas (kg/m·s);
P: mean density of the coarse particles (kg/m$^3$);
G: acceleration of gravity (9.8 m/s$^2$);
d: mean particle diameter of the surface layer-forming powder (m).

The layer of coarse particles can prevent the agglomeration of fluidized bed powders and protect the gas distributor against exposure to the highly reactive powders and gases.

18 Claims, 1 Drawing Sheet

METHOD FOR SURFACE TREATMENT

This application is a continuation of application Ser. No. 08/083,886, filed Jun. 28, 1993 now abandoned.

BACKGROUND OF THE INVENTION

1. Field of the Invention

This invention relates to an apparatus and method for surface treatment which includes a fluidized bed furnace. More particularly, it is an apparatus and method which can prevent the agglomeration of a powder forming a fluidized bed which will obstruct its uniform fluidization, and can also protect a gas distributor from a highly reactive powder, or atmosphere.

2. Description of the Related Art

There are known methods which employ a fluidized bed to form a carbide, nitride, or other surface layer on the material to be treated, as described in U.S. Pat. No. 4,844,949 which cover prior inventions of the inventors of this invention.

According to these methods, a fluidized bed furnace is supplied with a fluidizable powder mixture (hereinafter referred to as fluidized bed powders) consisting of a powder of alumina, or other refractory material (hereinafter referred to as a fluidizing agent), and a powder of a metal, or alloy, or both for forming a carbide, nitride, or other surface layer (hereinafter referred to as a surface layer-forming powder), and a fluidizing gas, such as argon, is introduced into the furnace to fluidize the fluidized bed powders to form a fluidized bed. The material to be treated is placed in the fluidized bed, and the bed is heated, while a halide is appropriately supplied into the bed, whereby a surface layer is formed on the material to be treated.

The reaction of the halide and the surface layer-forming powder produces the gas of a halide of the surface layer-forming element, and the reaction of the halide gas with carbon or nitrogen in the material to be treated forms the surface layer. It has, however, often been the case that during the process of formation of the surface layer, the agglomeration of a part of the fluidized bed powders occurs to form a mass in the fluidized bed, depending on the conditions employed for surface treatment, including the amount of the halide gas produced and the flow rate of the fluidizing gas. If any such mass is formed in the fluidized bed, the powders around the mass fail to be satisfactorily fluidized, and the fluidized bed lacks uniformity in temperature, and has, therefore, only a limited area in which it can form a uniform surface layer on the material to be treated. Moreover, the mass often interferes with a jig employed for holding the material to be treated in the furnace, and thereby disables it to be held in a proper position. Therefore, it is often necessary to interrupt the operation for surface treatment to remove any such mass.

The agglomeration of the powders in the fluidized bed can be diminished by increasing the flow rate of the fluidizing gas to achieve a higher degree of fluidization, or by decreasing the amount of the halide to be added. Both of these steps are, however, impractical, since the increased consumption of the fluidizing gas adds to the cost of the surface treatment, and the changes in the necessary conditions for the treatment, including the concentration of the reactive gas in the fluidized bed, result in the formation of a surface layer having an undesirably small, or uneven thickness.

The furnace employed by the known methods is provided with a gas distributor for distributing the fluidizing gas through the fluidized bed. The gas distributor is, however, in contact with the fluidized bed, and is, therefore, exposed to the halide gas in the fluidized bed. It is very likely that the gas distributor may be corroded by the halide gas, or that the fine openings thereof may be clogged with the reaction product. Such corrosion and clogging lower the function of the gas distributor.

SUMMARY OF THE INVENTION

It is, therefore, an object of this invention to provide an apparatus for surface treatment which can prevent the agglomeration of a powder forming a fluidized bed irrespective of the flow rate of a fluidizing gas, and other conditions employed for treatment, and can also protect a gas distributor from direct exposure to a highly reactive powder, or atmosphere, and thereby from corrosion, or other inconveniences.

The inventors of this invention have made a detailed study of the mechanism causing the agglomeration of a powder forming a fluidized bed which exerts an adverse effect on the surface treatment of the material placed therein, and possible means for overcoming the problem. As a result, the inventors have found that, if a fluidizing gas fails to flow uniformly, and leaves a part of surface layer-forming metal or alloy powders virtually immobile and in contact with one another for a prolonged time, those powders react and combine with one another to form a mass; that the mass grows by including powders of e.g., alumina as a fluidizing agent; and that it is possible to ensure the uniform flow of the fluidizing gas and there avoid the stagnation of powders in any part of the fluidized bed and the formation of any mass if a layer of coarse particles which are sufficiently heavy not to be movable by the fluidizing gas is provided above a gas distributor.

According to this invention, therefore, there is provided an apparatus for surface treatment which comprises: a furnace having an inlet for a fluidizing gas, a gas distributor for distributing the fluidizing gas arriving from its inlet, and a gas outlet; a fluidizable powder mixture placed in the furnace above the gas distributor, composed of a powder of alumina, or other refractory material, and a powder of a metal, or alloy, or both for forming a surface layer on the material to be treated; the fluidizable powder mixture being fluidized by the fluidizing gas to form a fluidized bed; a device for heating the furnace; and a layer of coarse particles disposed between the gas distributor and the fluidized bed, and having a mean diameter, D(m), as defined below:

$$(1650V\mu/PG)^{1/2} < D < 6.5d \tag{1}$$

where

V: flow rate of the fluidizing gas (m/s);

μ: viscosity coefficient of the fluidizing gas (kg/m·s);

P: mean density of coarse particles (kg/m$^3$);

G: acceleration of gravity (9.8 m/s$^2$)

d: mean particle diameter of the powder of a metal or alloy, or both (m), thereby forming the surface layer on the material to be treated under heating in the presence of a halide without agglomeration of fluidized bed powders.

The layer of coarse particles having the mean diameter as defined by the above formula (1), and disposed between the gas distributor and the fluidized bed, serves to enable the fluidizing gas to flow uniformly through the fluidized bed and thereby prevent the stagnation of the powders in any part of the bed. The following is a presumably, though not definitely, correct explanation of the mechanism which enables the layer of coarse particles to produce the result as described.

The expression "$(1650V\mu/PG)^{1/2}$" which gives the minimum value of the mean particle diameter D in formula (1) defines the maximum diameter of the particles which can be fluidized by a fluidizing gas flowing at a specific speed ["Reaction Engineering on Fluidized Beds" (1984), published by Baifukan]. Accordingly, the particles having a diameter which is greater than the D value given by the expression are not fluidizable, but can form the layer of coarse particles. In other words, the particles having a diameter which is smaller than the D value undergo fluidization, and fail to form any layer of coarse particles that separates the powders of the fluidized bed from the gas distributor. The expression "6.5d" which defines the maximum D value in formula (1) gives the mean diameter D of the coarse particles which allow the passage of the surface layer-forming powders having a mean diameter expressed as d. Accordingly, the layer of coarse particles having a diameter which is smaller than the D value given by the expression "6.5d" can decrease the passage of the surface layer-forming powders therethrough. In other words, the layer of coarse particles having a diameter which is greater than 6.5d has larger interstices among the particles, and allows a larger amount of surface layer-forming powders to enter the interstices and stay therein to hinder the flow of the fluidizing gas thereby cause the local stagnation of the powders in the fluidized bed. It is, therefore, necessary to ensure that the layer of coarse particles have a particle diameter which is smaller than the value defined by the expression on the right hand of formula (1). The layer of coarse particles having a mean diameter D falling within the range as defined by formula (1) has small interstices among the particles, and contains a large number of particles, and thereby enables the improved distribution of gas and thereby the uniform fluidization of the powders in the fluidized bed. The absence of any stagnation of the powders in the fluidized bed means the absence of any prolonged contact of the powders in any part of the fluidized bed, and makes it possible to restrict the possibility of any reaction between the metal, or the like powders and thereby prevent the agglomeration thereof. The layer of coarse particles isolates the powders of the fluidized bed from the gas distributor, and a difference in pressure which is produced between the layer of coarse particles and the fluidized bed powders prevents the back flow of the fluidizing gas and the halide gas through the layer of coarse particles. Therefore, there is no possibility of the gas distributor being exposed to the gases from the fluidized bed.

The layer of coarse particles prevents the stagnation of the powders in any part of the fluidized bed and thereby the agglomeration thereof, as hereinabove stated. The apparatus of this invention, therefore, makes it possible to avoid various problems including any insufficient fluidization that would result from the agglomeration of powders in the fluidized bed, the lack of uniformity in temperature of the fluidized bed that would result from any insufficient fluidization, any reduction in the effective area for treatment and any improper positioning of the jig for the material to be treated in the fluidized bed that would result from an increase in the agglomerated portion of the fluidized bed, and the necessity of interrupting treatment to remove any mass of powders from the fluidized bed, and thereby ensures an efficient surface treatment. The layer of coarse particles also protect the gas distributor from a highly reactive powder, or atmosphere in the fluidized bed.

DETAILED DESCRIPTION OF THE INVENTION

Figure 1:
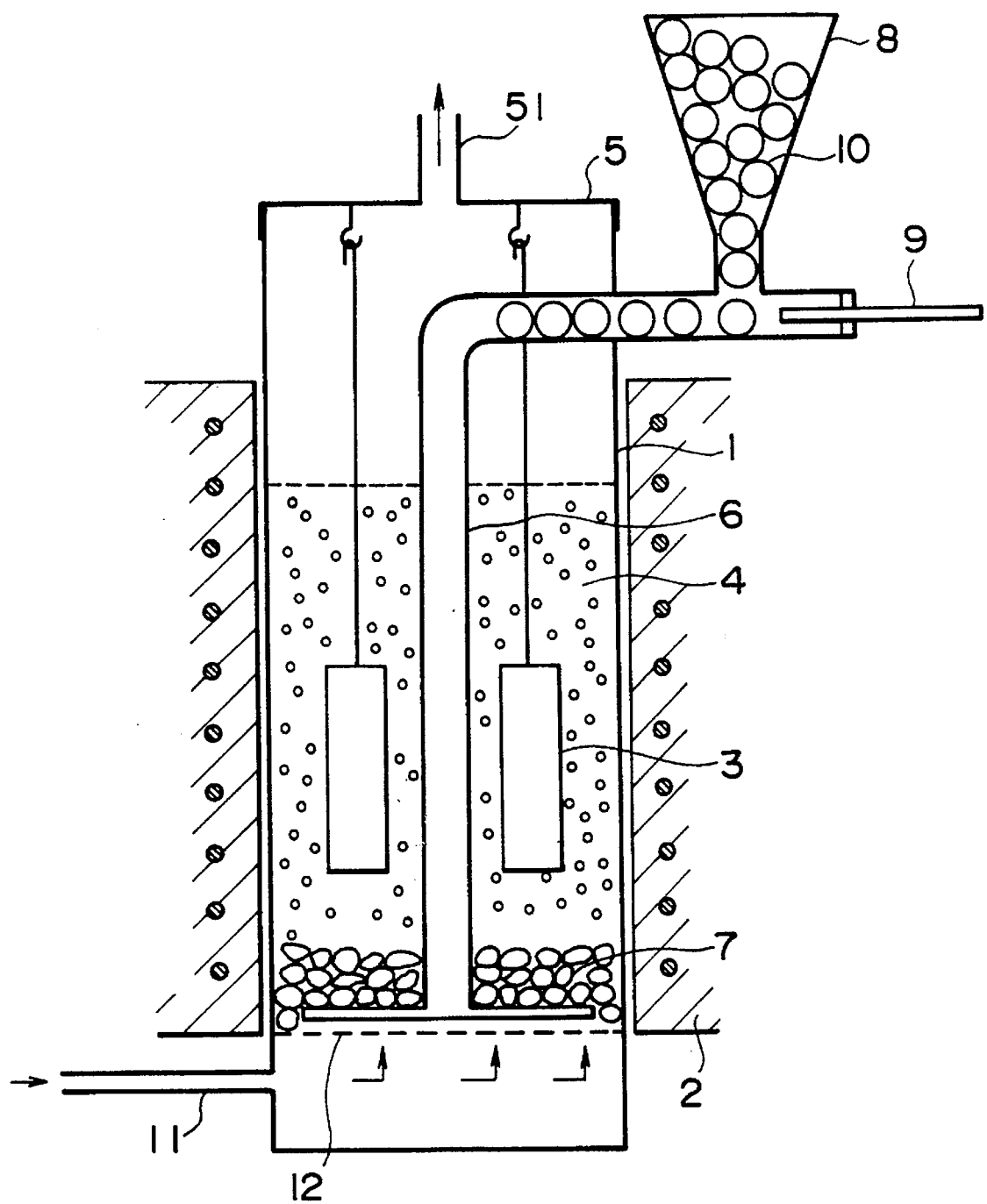
FIG. 1 is a schematic representation of an apparatus for surface treatment as used in Example 1 which will hereinafter be described.

The apparatus for surface treatment of this invention may comprise a fluidized bed furnace which is usually employed for dying, incineration, reduction, or other purposes. Therefore, it may, for example, comprise a furnace 1 having an inlet 11 for a fluidizing gas, such as argon, at its bottom, provided with a gas distributor 12 inwardly of the inlet 11, and surrounded by a heater 2 for heating a fluidized bed, as shown in FIG. 1. The furnace is provided at its top with a cover 5 having a gas outlet 51, and the cover 5 is removable to enable the material to be treated 3 to be charged into the furnace, or discharged therefrom. The furnace contains a layer 7 of coarse particles immediately above the gas distributor 12, and a fluidized bed 4 above the layer 7. The furnace is also provided with a device 6 for supplying a halide to the bottom thereof. The furnace may further be provided with, for example, a pipe through which a gas containing nitrogen is supplied from an external source of supply into the furnace, if it is employed for forming a nitride layer on the material to be treated.

As mentioned above, there are provided a layer 7 of coarse particles above the gas distributor and a layer of fluidized bed powders thereon. The fluidized bed powders consist of a refractory powder (i.e. fluidizing agent), and a powder of a metal, or alloy, or both for forming a surface layer (i.e. surface-layer forming powder). The fluidizing agent may be of any material that does not react with any of the elements constituting the material to be treated, and the surface layer-forming powder. It may, for example, be of alumina ($Al_2O_3$), silicon dioxide ($SiO_2$), titanium dioxide ($TiO_2$), or zirconia ($ZrO_2$), or a mixture thereof.

The surface layer-forming powder may be of a metal, or alloy, or both which can form a carbide, nitride, carbonitride, solid solution, intermetallic compound, etc. on the material to be treated. Therefore, it may, for example, be of a metal which easily combines with carbon or nitrogen to form a carbide, or nitride, such as chromium, vanadium or titanium, or an alloy such as Fe-Cr, Fe-V or Fe-Ti. It is also possible to use a plurality of metals or alloys together.

The surface layer-forming metal or alloy powder preferably has a particle diameter of 0.5 to $1.2 \times 10^{-4}$ m (80 to 350 mesh). It preferably has a mean particle diameter d of 0.5 to $1.2 \times 10^{-4}$ m.

Although the proportions of the fluidizing agent and the surface layer-forming powder may depend on, for example, the kind of the surface layer to be formed, and its thickness, it is usually appropriate to employ the surface layer-forming powder in the proportion of 2 to 80% by weight of the fluidizing agent. The fluidizing agent is so selected as to have a mean particle diameter d' which satisfies the following relationship to the mean particle diameter d, and density ρ, of the surface layer-forming powder:

$$(d')^3 \times \rho' = d^3 \times \rho$$

where ρ' stands for the means particle density of the fluidized bed-forming power.

The coarse particles forming the layer 7 may be of any material that does not react with the fluidized bed powders, or any gas produced in the fluidized bed. It is, however, preferable to employ particles of a refractory material, such as alumina ($Al_2O_3$), silicon dioxide ($SiO_2$), titanium dioxide ($TiO_2$) or zirconia ($ZrO_2$), or a mixture thereof. The coarse particles are required to have a mean diameter D as defined by formula (1) above. The coarse particles are not required to stay immobile, unless they move heavily to and away from the fluidized bed, but their two-dimensional movement is rather desirable for the uniform flow of the fluidizing gas.

The layer of coarse particles may include still greater particles, particularly adjacent to the gas distributor, so that a still smaller loss of pressure may be achieved.

The layer of coarse particles has a thickness of 5 to 300 mm. If its thickness is smaller than 5 mm, it cannot uniformly distribute the fluidizing gas leaving the gas distributor. If its thickness is larger than 300 mm, it creates an undesirably greater loss of pressure which calls for the supply of a larger amount of gas to achieve the same level of fluidization, while no such increase in thickness is expected to produce any correspondingly improved result in preventing the agglomeration of the powders in the fluidized bed.

The heater 2 surrounding the furnace 1 is usually an electric furnace, though it may alternatively be possible to employ any other appopriate device for heating the fluidized bed.

An inert gas, such as an argon, is usually employed as the fluidizing gas. A reactive gas containing nitrogen, such as an ammonia gas, may be added to the fluidizing gas if the apparatus is used to form a nitride, or carbonitride layer on the material to be treated. The flow rate and speed of the fluidizing gas in the fluidized bed are so selected as to active satisfactory fluidization. If they are too low, the insufficiency of fluidization results in the fluidized bed not having a uniform temperature distribution. If they are too high, a larger amount of gas is needed, and the gas causes heavy bubbling and makes it difficult to continue any satisfactory operation. The fluidizing gas has a viscosity coefficient of, for example, $6.3 \times 10^{-5}$ kg/m·s in case of argon, or $5.1 \times 10^{-5}$ kg/m·s in case of helium, at 1000° C.

The material to be treated depends on the surface layer to be formed thereon. It is usually a metallic material, such as iron, steel or nickel, or a nonmetallic material, such as an ultrahard alloy, or a carbonaceous material.

The halide may be of any composition if it can produce a halide gas which reacts with the surface layer-forming powder to enable it to form a surface layer on the material to be treated. It is possible to use, for example, an ammonium halide, a metal halide, an alkali or alkaline earth metal halide, or hydrogen halide, or a mixture thereof. The halide is used in the form of a powder, pellets, or gas, or a mixture thereof. Although the halide can be added to the powders forming the fluidized bed before the furnace is heated, it is usual practice to employ pellets and supply them into the fluidized bed through the pipe 6, as shown in FIG. 1. The amount of the halide to be added depends on, among others, the kind of the surface layer to be formed, and its thickness.

Further, the surface treatment is usually conducted by heating at a temperature of 400° to 1200° C. for 1 to 100 hours.

When the apparatus as hereinabove described is used for surface treatment, the layer of powders above the layer of coarse particles is fluidized by a fluidizing gas to form a fluidized bed, and the material to be treated is placed in the fluidized bed, and the fluidized bed is heated in the presence of a halide, whereby a surface layer is formed on the material to be treated.

The invention will now be described more specifically with reference to a few examples.

EXAMPLE 1

The apparatus as shown in FIG. 1 was used to form a carbide layer on a steel surface. The furnace 1 had an inside diameter of 50 mm. The layer 7 of coarse particles was of alumina, and had a thickness of about 100 mm. The layer of fluidized bed powders had a weight of 1000 g, which were a mixture of alumina powder having a mean diameter of $1.8 \times 10^{-4}$ m and ferrovanadium powder having a mean diameter of $1.2 \times 10^{-4}$ m. Argon gas was supplied into the furnace 1 through the gas inlet 11 and the gas distributor 12 at a flow rate of 12 liters per minute to fluidize the particles above the layer 7 to form a fluidized bed 4 having a thickness of about 260 mm.

The alumina particles forming the layer 7 of coarse particles had a diameter so selected by calculation as to satisfy the range of formula (1). The calculation of the value given by the lefthand expression in formula (1) was made by employing 0.10 m/s as the velocity V of the fluidizing argon gas, $6.3 \times 10^{-5}$ kg/m·s as its viscosity coefficient μ, $4.08 \times 10^3$ kg/m³ as the mean density P of the coarse alumina particles, and 9.8 m/s² as the acceleration of gravity G. It was $5.1 \times 10^{-4}$ m, while the righthand expression in formula (1) gave a value of $7.8 \times 10^{-4}$ m.

The furnace 1 was closed by the cover 5 having its gas outlet 51 connected to an exhaust gas disposal apparatus not shown, and the fluidized bed 4 was heated by the heater 2. The fluidized bed shows a higher degree of fluidization with an elevation in temperature if the fluidizing gas is supplied at a constant rate. Therefore, the flow rate of the fluidizing gas was gradually decreased with an elevation in temperature of the fluidized bed, so that the fluidizing gas might be supplied at a rate of 2.6 liters per minute when the bed had a temperature of 1000° C. As a result, the bed showed substantially the same degree of fluidization at the temperature of 1000° C. as at room temperature. Then, pieces of cold rolled tool steel known as SKD 11 were placed in the fluidized bed 4 as the material to be treated 3.

A hopper 8 was charged with ammonium chloride pellets 10 employed as activator, and having a diameter of $5 \times 10^{-3}$ m, and the pellets 10 leaving the hopper 8 at its bottom were pushed by a rod 9 so as to drop down the pipe 6 at an average rate of 0.8% by weight per hour relative to fluidized bed powders. After two hours of operation, the cover 5 was removed, and the materials 3 which had been treated were discharged from the furnace 1, and air cooled to room temperature.

The heater 2 was turned off, while the supply of the fluidizing gas was continued, and after the furnace 1 had been cooled to room temperature, the fluidized bed powder were immediately removed from the furnace 1, and put through a 1.2 mm (14-mesh) sieve. The masses of powders retained on the sieve were weighed as a measure of agglomeration.

Comparison was made by employing four types of layers 7 consisting of diametrically different coarse particles, respectively, i.e. a type of particles having a mean diameter of $6 \times 10^{-4}$ which falls within the range as defined by formula (1), and three types of particles having mean diameters of $2.1 \times 10^{-4}$, $10 \times 10^{-4}$ and $20 \times 10^{-4}$ m, respectively, which do not, as shown in Table 1 below. In all of the cases, it was possible to form a vanadium carbide layer having a uniform thickness of five to six microns on the surface of the material to be treated. There was, however, a great difference in the weight of agglomerated powders in the fluidized bed, as shown in Table 1. A large number of masses having a diameter of several centimeters were retained on the sieve when the layer 7 was of particles having mean diameters of $10\times10^{-4}$ and $20\times10^{-4}$ m which were larger than the range as defined by formula (1) when the mean diameter d of the surface layer-forming powders was $1.3\times10^{-4}$ m. There was, however, no agglomeration when the layer 7 was of particles having a mean diameter of $6\times10^{-4}$ m falling within the range as defined by formula (1), or of particles having a mean diameter of $2.1\times10^{-4}$ m which was smaller than the range. The particles having a mean diameter of $2.1\times10^{-4}$ m were, however, too small to resist fluidization and protect the gas distributor from exposure to the powders and gases from the fluidized bed.

TABLE 1

| Mean diameter of coarse particles ($\times 10^{-4}$ m) | Weight of agglomerated powders (g) |
| --- | --- |
| 2.1 | 0 |
| 6 | 0 |
| 10 | 7 |
| 20 | 17 |

EXAMPLE 2

The treatment for forming a carbide surface layer was made by repeating Example 1, except for employing a furnace having an inside diameter of 200 mm, a layer of coarse particles having a thickness of 100 mm, a fluidized bed having a thickness of 600 mm, and supplying ammonium chloride pellets at an average rate of 0.01% by weight per hour relative to the fluidized bed powders, and the fluidizing gas at a flow rate of 40 liters per minute at 1000° C. As a result of the alterations in the inside diameter of the furnace and the flow rate of the fluidizing gas, the left-hand expression in formula (1) gave a value of $4.9\times10^{-4}$ m.

Comparison was made by employing four types of layer 7 consisting of diametrically different coarse particles, as in Example 1. The results are shown in Table 2 below. There was a large amount of agglomeration when the layer 7 was of particles having mean diameters of $10\times10^{-4}$ and $20\times10^{-4}$ m which were larger than the range as defined by formula (1), but there was no agglomeration when the layer 7 was of particles having a mean diameter of $6\times10^{-4}$ m or $2.1\times10^{-4}$ falling within, or smaller than the range, respectively. The particles having a mean diameter of $2.1\times10^{-4}$ m were, however, too small to resist fluidization and protect the gas distributor from the powders and gases from the fluidized bed, as in Example 1. Thus, it is obvious that the provision of a layer of appropriately coarse particles between the fluidized bed and the gas distributor makes it possible to prevent the agglomeration of the powders in the fluidized bed and protect the gas distributor against exposure to the powders and gases from the fluidized bed.

TABLE 2

| Mean diameter of coarse particles ($\times 10^{-4}$ m) | Weight of agglomerated powders (g) |
| --- | --- |
| 2.1 | 0 |
| 6 | 0 |
| 10 | 100 |
| 20 | 800 |

What is claimed is:

1. A method for forming a surface layer on a material to be treated in a fluidized bed in a furnace having a gas distributor and comprising the steps of:

introducing a fluidizable powder mixture composed of a) a powder of refractory material and b) a surface layer-forming powder of a metal and/or alloy into the furnace;

introducing, above the gas distributor and between and adjacent to said fluidizable powder mixture and said gas distributor, a layer of coarse particles having a mean diameter, D (m), as defined by the following formula:

$$(1650 V\mu/PG)^{1/2} < D < 6.5d < 780\times10^{-6} \text{ m}$$

where

V: velocity of a fluidizing gas (m/s);
   μ: viscosity coefficient of the fluidizing gas (kg/m·s);
   P: mean density of the coarse particles (kg/m);
   G: acceleration of gravity (9.8 m/s²);
   d: mean particle diameter of the powder of a metal and/or alloy (m), fluidizing said fluidizable powder mixture by said fluidizing gas having the velocity V supplied through said gas distributor to form a fluidized bed; and forming said surface layer on the material to be treated under heating in the presence of a halide, whereby said layer of coarse particles prevents fluidized bed powders from agglomeration.

2. A method of claim 1 wherein the mean diamter, D (m), of the coarse particles is more than $39\times10^{-6}$.

3. A method of claim 1 wherein the halide is introduced into the fluidized bed while the material is being treated in said bed.

4. A method as set forth in claim 1, wherein said surface layer-forming powder is one capable of forming a carbide, a nitride, a carbonitride, a solid solution or an intermetallic compound.

5. A method of claim 4 wherein the mean diameter, D (m), of the coarse particles is more than $39\times10^{-6}$.

6. A method of claim 4 wherein the halide is introduced into the fluidized bed while the material is being treated in said bed.

7. A method as set forth in claim 1, wherein said coarse particles comprise at least one member selected from the group consisting of alumina ($Al_2O_3$), silicon dioxide ($SiO_2$), titanium dioxide ($TiO_2$) and zirconia $ZrO_2$).

8. A method of claim 7 wherein the mean diameter, D (m) , of the coarse particles is more than $39\times10^{-6}$.

9. A method of claim 7 wherein the halide is introduced into the fluidized bed while the material is being treated in said bed.

10. A method as set forth in claim 1, wherein said halide is at least one member selected from the group consisting of an ammonium halide, an alkali metal halide, an alkaline earth metal halide, a halide of a different metal, and a hydrogen halide.

11. A method of claim 10 wherein the mean diameter, D (m), of the coarse particles is more than $39\times10^{-6}$.

12. A method of claim 10 wherein the halide is introduced into the fluidized bed while the material is being treated in said bed.

13. A method of precluding agglomeration of fluidized bed powder in a fluidized bed in surface-treating apparatus, the surface-treating apparatus providing means for forming a surface layer on material to be treated and comprising a furnace, a gas distributor, a fluidizable powder mixture, means to heat the furnace, gas inlet means below the gas distributor, gas outlet means above the gas distributor, and a layer of coarse particles positioned above the gas distributor and between and adjacent to the gas distributor and the fluidizable powder mixture, the fluidizable powder mixture being below the gas outlet means, comprising powder of alumina or other refractory material and powder, having a mean particle diameter, d (m), of a member elected from the group consisting of a metal and an alloy and suitable for forming a surface layer on the material to be treated, and forming a fluidized bed when fluidizing gas is introduced into said furnace over a sustained period of time at a velocity, V, and which comprises:
 a) introducing gas, for fluidizing the fluidized bed, through the gas inlet means at a velocity, V (m/s), suitable for fluidizing the fluidizable powder mixture and maintaining the fluidized bed, when said bed is at a suitable temperature,
 b) distributing the fluidizing gas through said gas distributor, and
 c) providing the layer of coarse particles with a mean particle diameter, D (m), defined by the following equation:

$$(1650V\mu/PG)^{1/2} < D < 6.5d < 780 \times 10^{-6} \text{ m}$$

wherein
 P is the mean density ($kg/m^3$) of the coarse particles,
 $\mu$ is the viscosity coefficient (kg/m·s) of the fluidizing gas,
 G is acceleration of gravity (9.8 $m/s^2$), and
 d) forming the surface layer on the material to be treated under heat and in the presence of a halide, whereby agglomeration of the fluidized bed powder is precluded.

14. A method of 13 wherein the mean diameter, D (m), of the coarse particles is more than $39 \times 10^{-6}$.

15. A method of claim 13 wherein the halide is introduced into the fluidized bed while the material is being treated in said bed.

16. In a method for preventing fluidized-bed-powder agglomeration when surface-treating a material in a fluidized bed and comprising a) sequentially passing fluidizing gas upwardly through a gas distributor, through a layer of coarse particles and into a surface-treating fluidizable powder mixture having a mean particle diameter, d (m), and at a velocity, V (m/s), suitable for fluidizing the fluidizable powder mixture, and b) maintaining said fluidizing powder mixture at a surface-treating temperature, the improvement wherein the layer of coarse particles has a mean particle diameter, D (m), defined by the following equation:

$$(1650V\mu/PG)^{1/2} < D < 6.5d < 780 \times 10^{-6} \text{ m}$$

wherein
 is the mean density ($kg/m^3$) of the coarse particles,
 $\mu$ is the viscosity coefficient (kg/m·s) of the fluidizing gas, and
 G is acceleration of gravity (9.8 $m/s^2$).

17. A method of claim 16 wherein the mean diameter, D (m), of the coarse particles is more than $39 \times 10^{-6}$.

18. A method of claim 16 wherein the halide is introduced into the fluidized bed while the material is being treated in said bed.

* * * * *